United States Patent
Abramov

[19]
[11] Patent Number: 6,087,920
[45] Date of Patent: Jul. 11, 2000

[54] MONOLITHIC INDUCTOR

[75] Inventor: Igor Abramov, Del Mar, Calif.

[73] Assignee: Pulse Engineering, Inc., San Diego, Calif.

[21] Appl. No.: 08/798,636

[22] Filed: Feb. 11, 1997

[51] Int. Cl.⁷ .............................. H01F 27/29; H01F 27/30
[52] U.S. Cl. .......................... 336/192; 336/200; 336/208; 336/223
[58] Field of Search .................................. 336/192, 198, 336/208, 200, 223; 338/322, 324

[56] References Cited

U.S. PATENT DOCUMENTS

| | | | |
|---|---|---|---|
| 1,767,715 | 6/1930 | Stoekle | 336/200 |
| 2,913,640 | 11/1959 | Edgarton | 336/192 |
| 3,585,553 | 6/1971 | Muckelroy | 336/208 |
| 5,003,279 | 3/1991 | Morinaga et al. | 336/192 |
| 5,359,315 | 10/1994 | Inque et al. | 336/200 |

FOREIGN PATENT DOCUMENTS

| | | | |
|---|---|---|---|
| 0 025 605 A1 | 9/1980 | European Pat. Off. | |
| 3042433 | 7/1982 | Germany | 336/192 |
| 56-160014 | 12/1981 | Japan. | |
| 58-79706 | 5/1983 | Japan | 336/192 |
| 62-9607 | 1/1987 | Japan | 336/192 |
| 4-216603 | 8/1992 | Japan | 336/192 |
| 08 055728 | 6/1996 | Japan. | |
| 68 073 | 10/1972 | Luxembourg. | |
| 397536 | 8/1933 | United Kingdom | 336/192 |

*Primary Examiner*—Thomas J. Kozma
*Attorney, Agent, or Firm*—Baker & Maxham

[57] ABSTRACT

A monolithic inductor (10) comprises an elongated substrate having opposite distal ends (14) and (16), each end having an end cap extending from the opposite ends to support the substrate (12) in spaced relation from a PC board, the end caps being formed with non-mounting areas and a deflection area for preventing the substrate resting on the non-mounting area, a substantially steep side wall (16) on the substrate side of the end cap (14) at the non-mounting area, and an inclined ramp extending up to a top of the end cap on the substrate side substantially opposite the non-mounting area, an electrically conductive soldering band (30) extending partially around each end cap, each soldering band having a gap (34) at the non-mounting area for thereby reducing parasitic conduction in the band (30), and an electrically conductive layer formed on the substrate in a helical path extending between the opposite ends and in electrical contact with the conductive soldering bands (30) at the ramps (120).

9 Claims, 5 Drawing Sheets

MONOLITHIC INDUCTOR

BACKGROUND OF THE INVENTION

The present invention relates to miniature inductors and pertains particularly to improved monolithic inductors and a method of manufacturing the same.

Miniature inductors are widely used in radio frequency electric circuits. The inductors are made in two basic configurations: wire wound and monolithic. Wire-wound inductors are made with a wire wound on a dielectric or a ferrite core, or they can be made free-standing. provided a wire of sufficient thickness is used to ensure stability. There are several types of monolithic inductors: multilayer ceramic and ferrite, a single-layer spiral, and helical.

Wire-wound inductors, especially the ones wound on dielectric cores or free-standing, generally have high Q-factor values, but are characterized by high cost. It is also relatively complicated to provide an inductor having an exact inductance value, due to the fact that the locations of wire termination points are usually fixed on a core, so fractional wire turns are sometimes not possible. One solution to this problem has been to select cores of different diameters for various inductance values, but this leads further to increased costs due to the need to adjust winding and handling machinery and the need for expanded core inventories.

In addition, the repeatability of the winding process, especially in cases where the inductance value is relatively low and only a few wire turns are required, is limited by the same need to attach the ends of the wire to the fixed locations on the core.

The multi-layer monolithic inductors are made of a series of stacked ceramic or ferrite layers each having a conductive trace deposited on its surface. The traces on adjacent ceramic layers are electrically interconnected. Multi-layer inductors are generally less expensive than wire-wound but have significantly lower Q-values, which limits their usefulness in some applications.

A spiral-type of inductor consists of a flat ceramic substrate on which single layer flat spiral metal pattern is defined. They have the same limitations as the multi-layer inductors.

A helical-type monolithic inductor consists of a substrate forming an elongated ceramic or ferrite core. The substrate is covered with one or more metal layers which are then etched or cut in a helical fashion, either mechanically or with a laser beam. The cut defines a helical winding similar to a wire coil. The ends of the core usually have metal caps in electrical contact with the conducting layer. The metal caps customarily have a solderable coating defining terminals to facilitate soldering of the inductor to a printed circuit board.

I have discovered through extensive testing that the end caps on the current helical monolithic inductors act as shortened windings. These shortened windings introduce parasitic losses which lead to diminished Q-values and lower inductance values. I have also discovered that without continuous metallization at the end caps significantly increased Q-values, and inductance values are obtained.

It is desirable to reduce cost of electrical components such as inductors without sacrificing performance of the systems they are made part of. It is also desirable to provide inductors as close to the stated nominal value as possible, with minimal process variations. This is known in the art as "high tolerance". Having inductors with high tolerance is desirable since it may obviate the use of tunable components, such as inductors and capacitors in end products.

SUMMARY AND OBJECTS OF THE INVENTION

It is the primary object of the present invention to provide an improved monolithic inductor and method of manufacturing same.

In accordance with a primary aspect of the present invention a monolithic inductor comprises an elongated substrate having opposite distal ends and having and end cap extending from each of said opposite ends to support and space said substrate from a PC board an electrically conductive layer formed on said substrate and extending between said opposite ends to provide a winding, and an electrically conductive soldering band extending partially around said end caps at each end of said substrate in electrical contact with said conductive layer, each soldering band having a gap to thereby reduce parasitic conduction in the band.

BRIEF DESCRIPTION OF THE PREFERRED EMBODIMENTS

The above and other objects and advantages of the present invention still become apparent from the following description when read in conjunction with the accompanying drawings wherein.

DETAILED DESCRIPTION OF THE PREFERRED EMBODIMENTS

Figure 1:
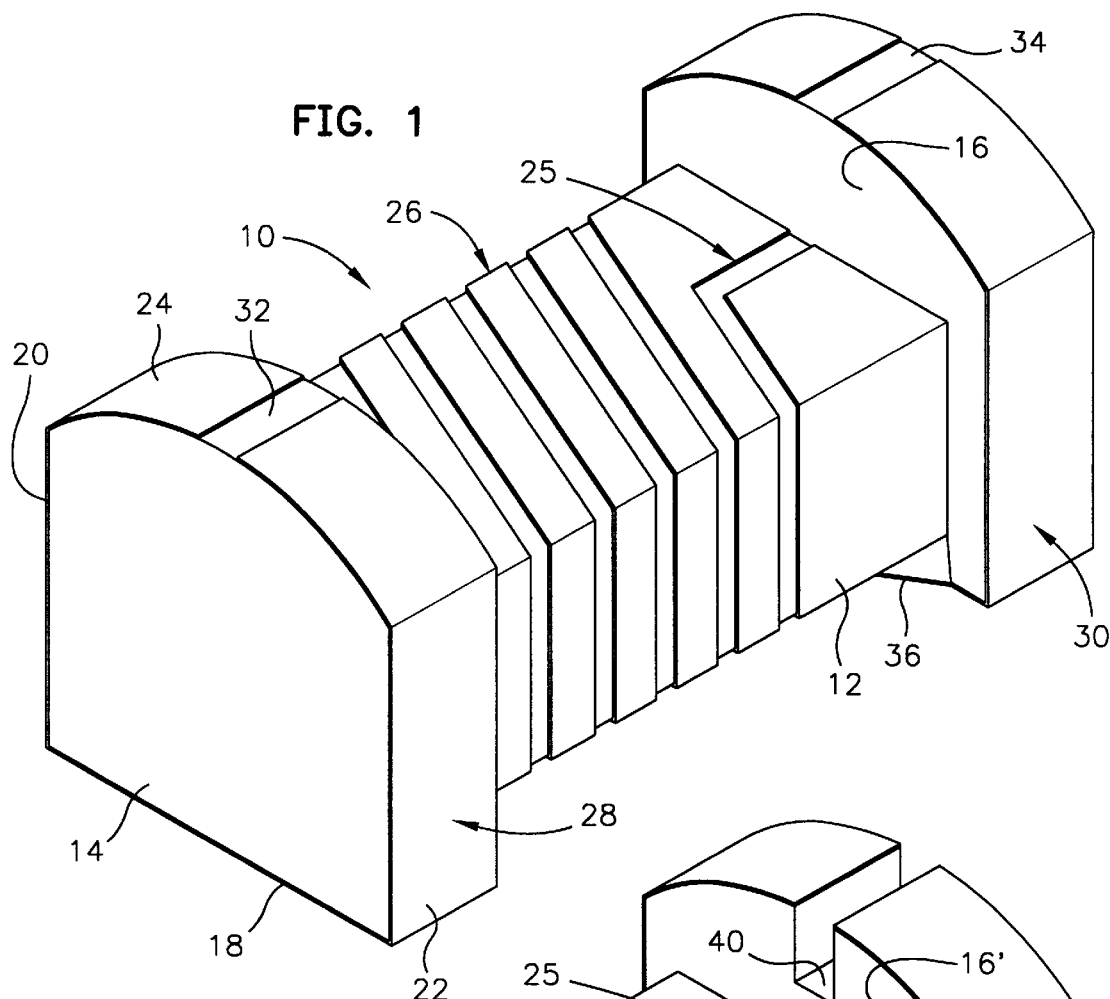
FIG. 1 is a perspective view of a monolithic inductor in accordance with a preferred embodiment of the invention.

Referring to FIG. 1, an exemplary embodiment of the monolithic inductor in accordance with the present invention is illustrated and designated generally by the numeral 10. The inductor is constructed with a support structure comprising an elongated central core or substrate which in the illustrated embodiment comprises a rectangular bar 12, having end caps or flanges 14 and 16 which extend radially outward beyond the surface of the central substrate 12. The end caps support the central portion of the substrate in spaced relation to a PC board on which it is mounted. The core 12 in this embodiment is illustrated as having a generally rectangular cross-sectional configuration, but it may have any configuration, such as circular or oval. The end caps or rims are identical and are shaped for ease of positioning on a PC board. As illustrated, each end cap is formed with three planar sides and a round or semi-circular side. The end cap 14, for example, has a base surface 18 having a generally planar rectangular configuration with side edges 20 and 22 having similar planar rectangular configurations. A top edge 24 is formed as an arc or segment of a circle to provide a non-mounting area so that the core or substrate will roll to one or the other side if placed on the top edge.

The central core 12 may be of any suitable material such as ceramic or ferrite. It is formed with helical conductive strips or ribbons 26 forming the winding which is electrically connected to conductive terminal bands or strips forming terminal bands 28 and 30 extending around the peripheral edges of the end caps 14 and 16. Only the peripheral edges of the end caps are metallized and it is imperative that there is no metallization on end face 14. The terminal bands 28 and 30 are interrupted by gaps 32 and 34 on the upper arc or circular portions of the end caps so that they do not act as shortened windings. The arc edge ensures that the inductor will roll to one of the sides if is accidentally placed on this edge and the gap will not be bridged by solder connecting it to a PC board.

This gap eliminates the shortened winding effect of the terminal bands as previously described, for the coil. Thus, it eliminates the parasitic losses which lead to diminished Q-factor values, as well as lower inductive values. Inductors of this construction hare been found to have about equal inductance and Q factor as wire wound inductors at much less cost in construction.

The applicant has discovered that inductors without end caps or continuous metallization at the ends have significantly increased Q-factor values and inductive values with respect to similar parts with the end caps.

These end caps are designed such that the inductor may be mechanically placed on PC boards and will rest on one of the planar side edges, as opposed to the circular edge 24. If placed on the circular edge it will roll to a side edge before coming to rest so that when it is bonded by solder reflow to a PC board the gap will not be bridged and remains in the end cap.

The windings on the substrate are formed by the application of a metallization coating to the surface of the substrate and thereafter laser cut away the coating in a spiral manner or pattern 25 to leave conductive strip or winding 26 in the helical path as desired. The laser cut 25 preferably starts at the inner face of end cap 16 and extends inward to begin and continue the spiral path which progresses along the core to the face of the other end cap 14. Similarly, the gaps 32 and 34 on the end caps may be formed by laser cutting away of a strip of the metallized surface.

The metallization may be applied by any suitable well-known means, and ally suitable conductive metal or ink may be utilized. Similarly, the substrate or core may be formed of any suitable material, such as a dielectric material, a ferrite material, or any other suitable form of metallic or ceramic materials. By way of example, the coating may comprise a tungsten underlay or coating with a second coating of nickel and a final coating of solder. The end faces of the end caps may not receive a coating of metal during the coating of the substrate. In order to ensure connection between the winding and the terminal bonds, a bridge or ramp, only one 36 being shown, is provided between the central core and the edge of the end caps. This ramp receives a coating of metal during the metal deposition on the substrate.

Figure 2:
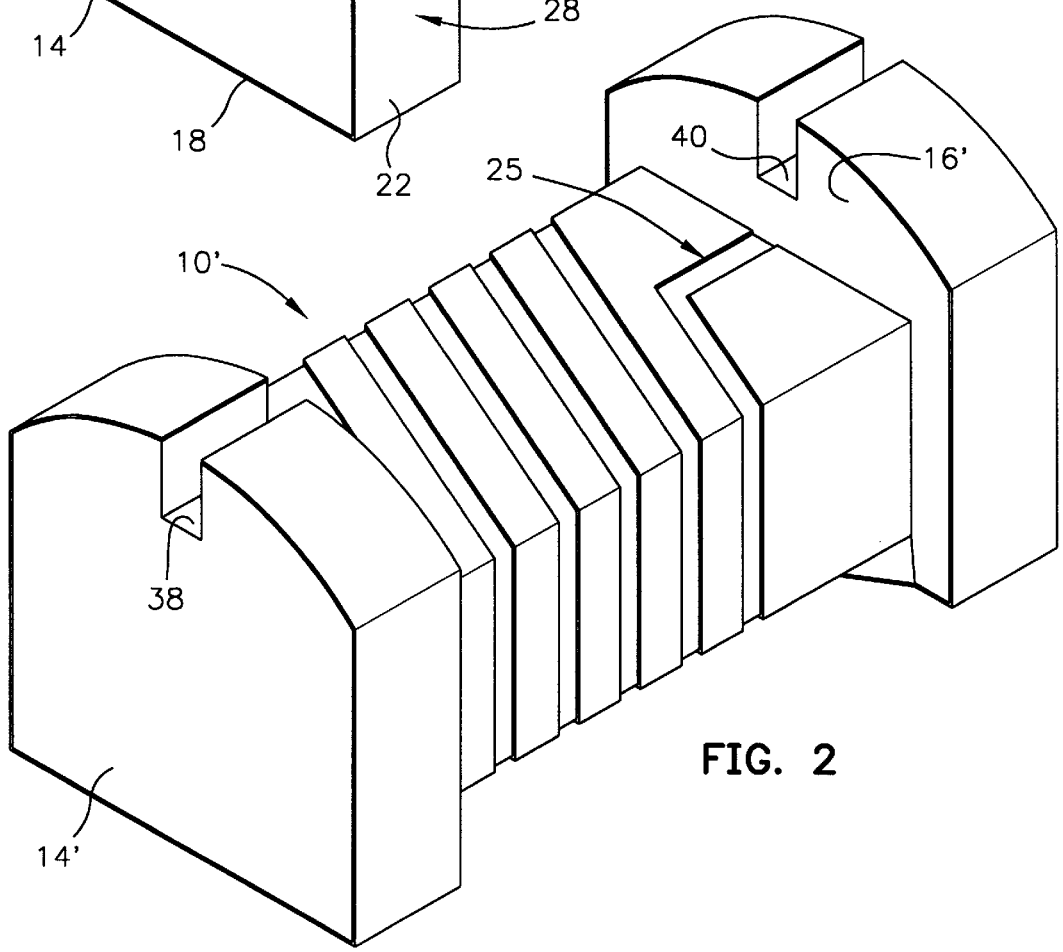
FIG. 2 is a view like FIG. 1 of a modification of the embodiment of FIG. 1.

Referring to FIG. 2 of the drawings, a further modification of the embodiment of FIG. 1 is illustrated and designated 10' generally. This is a modification wherein instead of mere gaps in the conductive terminal strips notches 38 and 40 are formed in the end caps 14' and 16'. These notches have a depth that is sufficient to ensure that no metallized plate or metallization will occur in the notch to bridge the gap. This eliminates the possibility of a conductive ring on the end caps. The two inductors 10 and 10' are otherwise identical.

Figure 3:
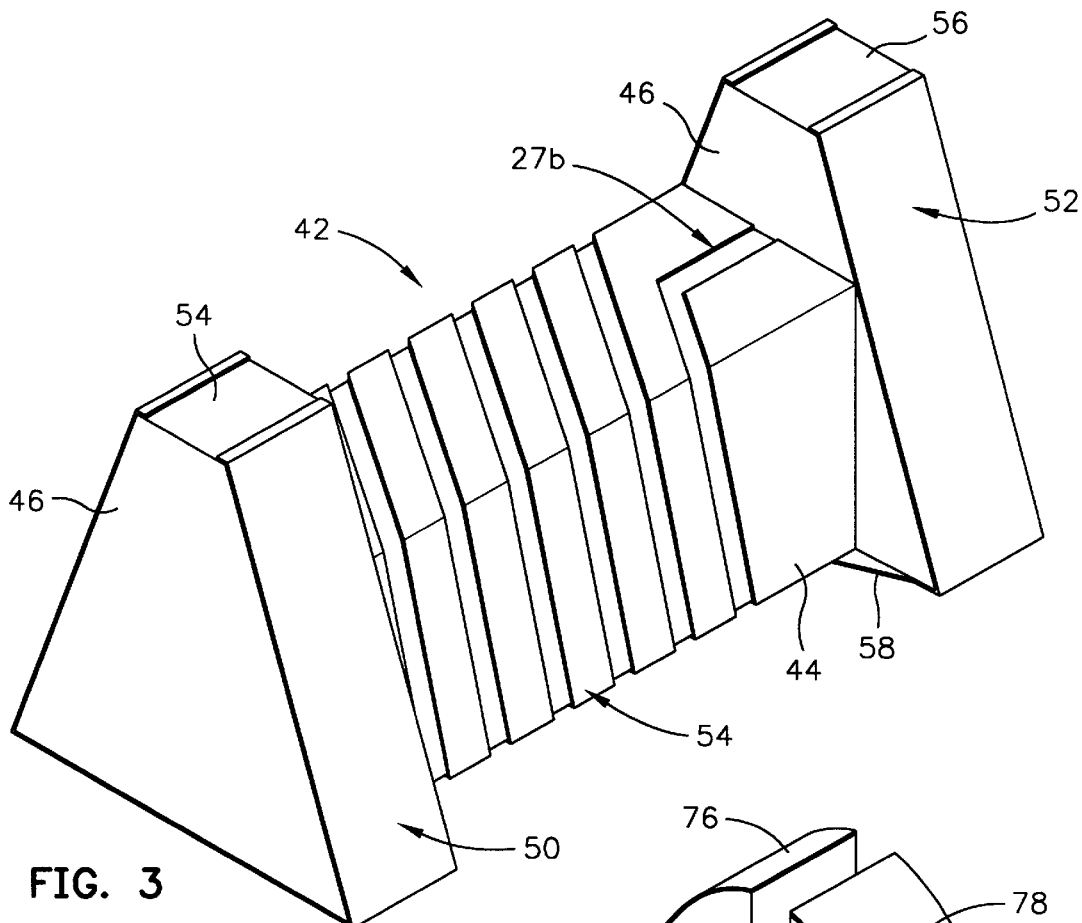
FIG. 3 is a view like FIG. 1 of an alternate embodiment of the present invention.

Variations in the shape of the end caps, as hereinafter discussed, may also provide certain advantages. Referring, for example, to FIG. 3, an inductor designated generally by the numeral 42 has a central core 44 and triangular-shaped end caps 46 and 48. As in the prior embodiment, the end caps have peripheral conductive strips or terminals 50 and 52 which are conducively or electrically connected to the winding 54 on the core. The end caps are free of metallization on the end faces thereof. The end caps 46 and 48 are formed with planar rectangular sides intersecting at points. In this embodiment, gaps 54 and 56 in the terminal bands or peripheral conductors are formed at the apexes of the triangular end caps. With this embodiment, mechanical placement of the inductor on a PC boa(rd ensures that it will rest on one of the straight or rectangular sides of the end caps. It will not rest on the points of its triangles. In addition, the gaps may be formed very easily by an abrasion process, such as grinding of the corresponding apex or points of the end caps. This embodiment is also provided with a ramp, only one of which, 58 is shown.

Figure 4:
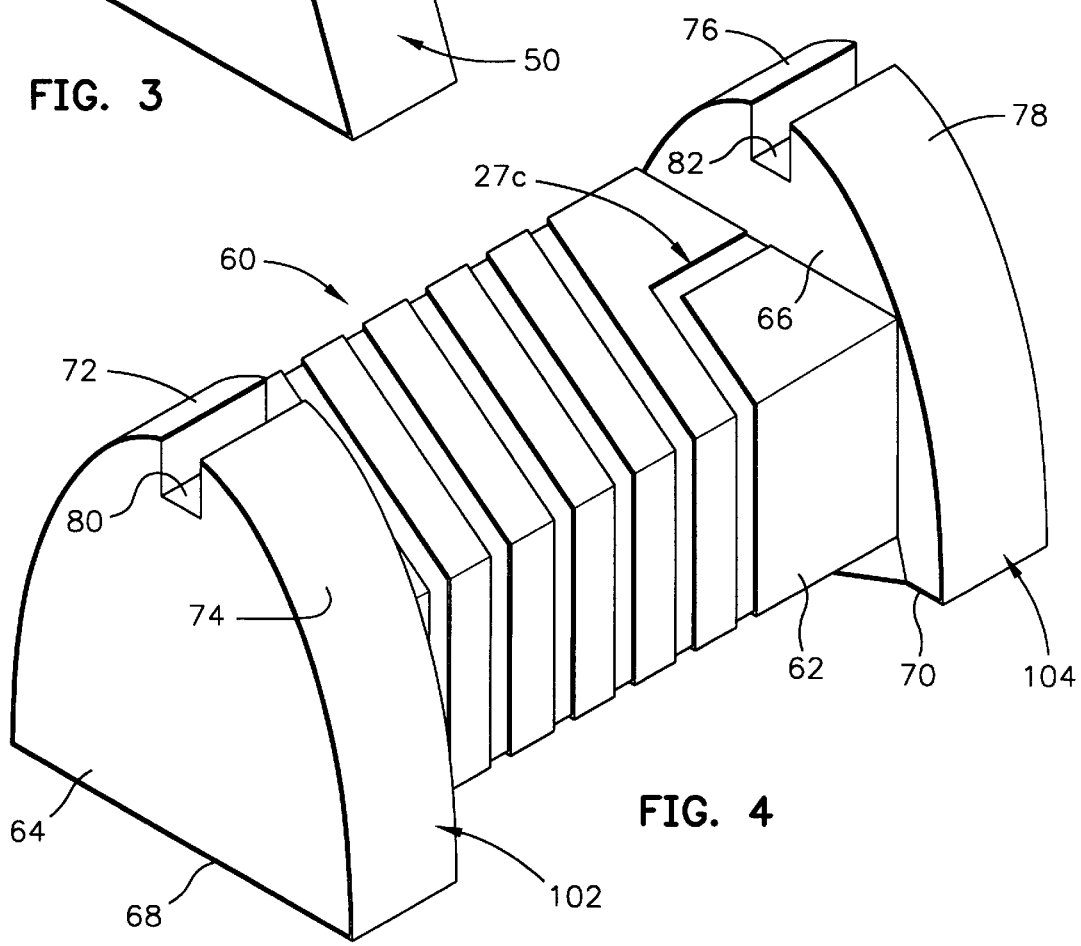
FIG. 4 is a view like FIG. 1 of a further embodiment of the present invention.
Figure 5:
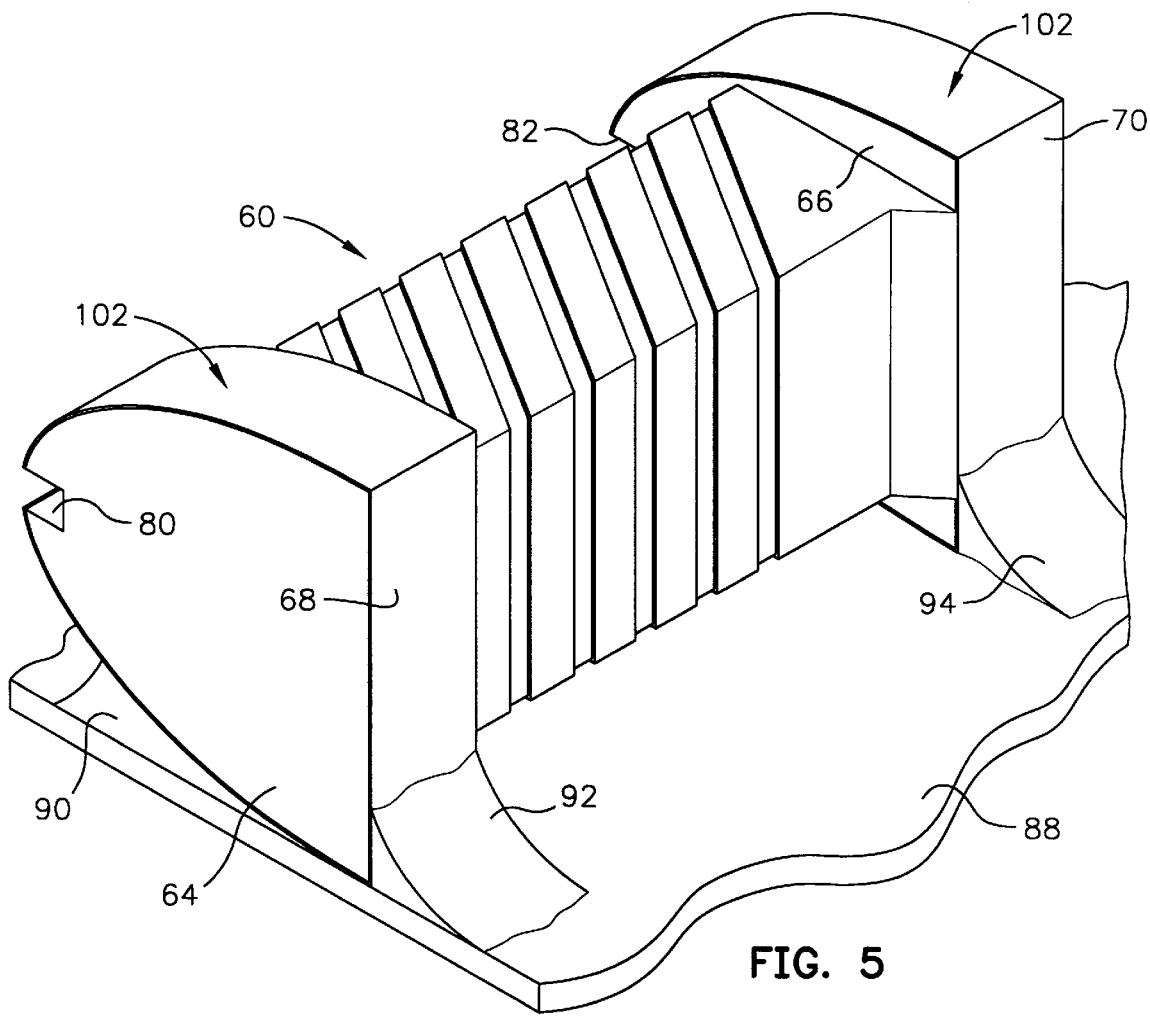
FIG. 5 is a perspective view of the embodiment of FIG. 4 shown soldered to a PC board.
Figure 6:
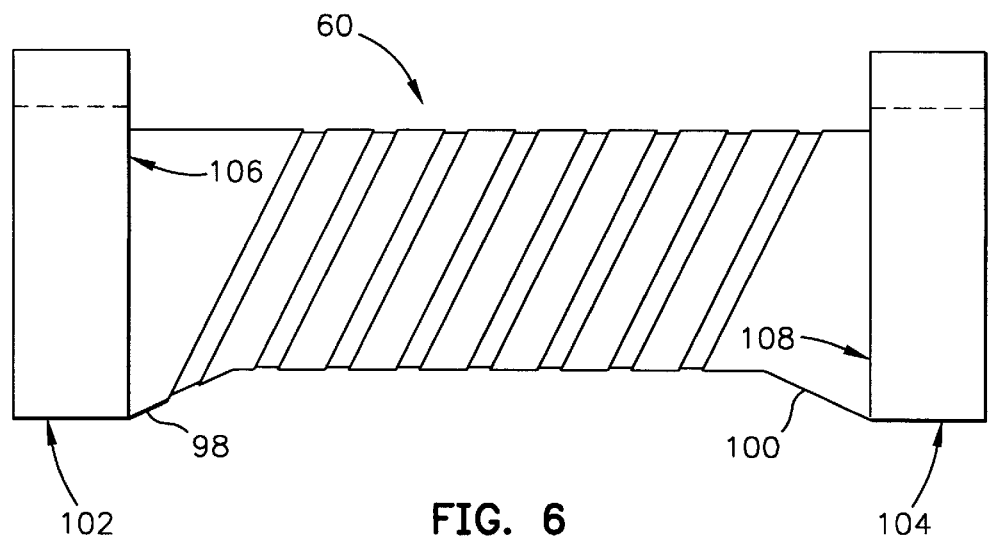
FIG. 6 is a side elevation view of the embodiment of FIG. 4.

Referring now to FIGS. 4–6, a further embodiment is illustrated wherein an inductor designated generally by the numeral 60, comprises a central core 62 with end caps 64 and 66. The end caps in this embodiment are formed with planar rectangular bases 68 and 70 with substantially continuously curved side edges 72, 74, 76 and 78 extending from the ends of the bases and joining at sharply curved areas or points where notches 80 and 82 are formed. The notches 80 and 82 provide the necessary gaps in conductive terminal bands 102 and 104 extending around the peripheral edges of the end caps 64 and 66.

This configuration also ensures that when placed on a PC board 88 as shown in FIG. 5, the inductor, if resting on a side other than the base, will not rest with the gaps or notches 80 and 82 in position to be closed by solder fillets 90, 92 and 94, bonding the inductor to the PC board. When resting on the side, as illustrated in FIG. 5, the inductor will rest on a lower portion of either side, such that the gaps 80 and 82 are spaced from the surface of the PC board.

Referring to FIG. 6, a side elevation view is illustrated of the inductor 60 shorting other features in accordance with the invention. In this embodiment, the substrate for the inductor 60, for example, has the central core formed with either a cylindrical or rectangular cross-section over the major portion of the length thereof. However, on the bottom side or side opposite the gaps, are ramps 98 and 100 which provide a conductive path from the winding on the core to the terminal strips or bands 102 and 104 on the end caps 64 and 66. This will ensure that an adequate metallization coating extends from the coating on the central core to that on the end caps. The end caps are also provided with steep inner walls 106 and 108 on the core side of the end caps 64 and 66 which prevent or avoid metallization in the metallization process and reduce the chance of bridging and/or shorting the gap. This arrangement is particularly effective for metal film deposition by evaporation.

Figure 7:
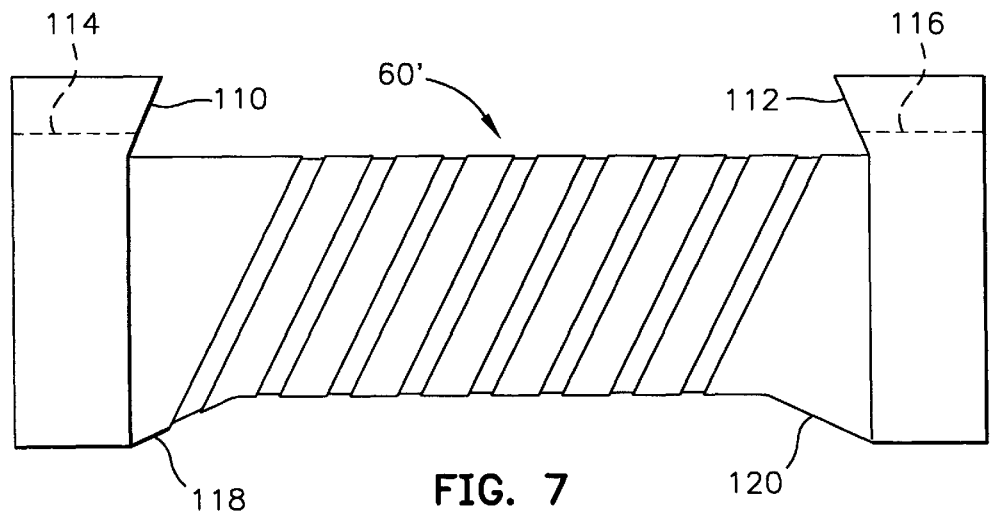
FIG. 7 is a view like FIG. 6 of a modification of the embodiment of FIG. 4.

Referring to FIG. 7, the end walls may also be undercut to further ensure no metallization, and thus no shorting of the gaps in the terminal paths. As illustrated, a modification of the FIGS. 4–6 embodiment designated generally as 60' has undercut walls 110 and 112, at least in the vicinity of gaps 114 and 116. However, the walls of the end caps are preferably undercut all around except at the bridges or ramps 118 and 120. Both steep walls and undercut will not be coated by commonly used conductive layer application methods, such as screen printing, electro- or electro-less plating, plasma spraying and the like. Any and all of the above separately illustrated and described features are applicable to each and every embodiment described herein and the equivalents thereof.

The present invention also contemplates procedures which ensure the manufacturing of inductors as close to the stated nominal value as possible. This is known as having a high tolerance. This eliminates the need for tunable components, such as trimmable inductors and capacitors in the end products.

Figure 8:
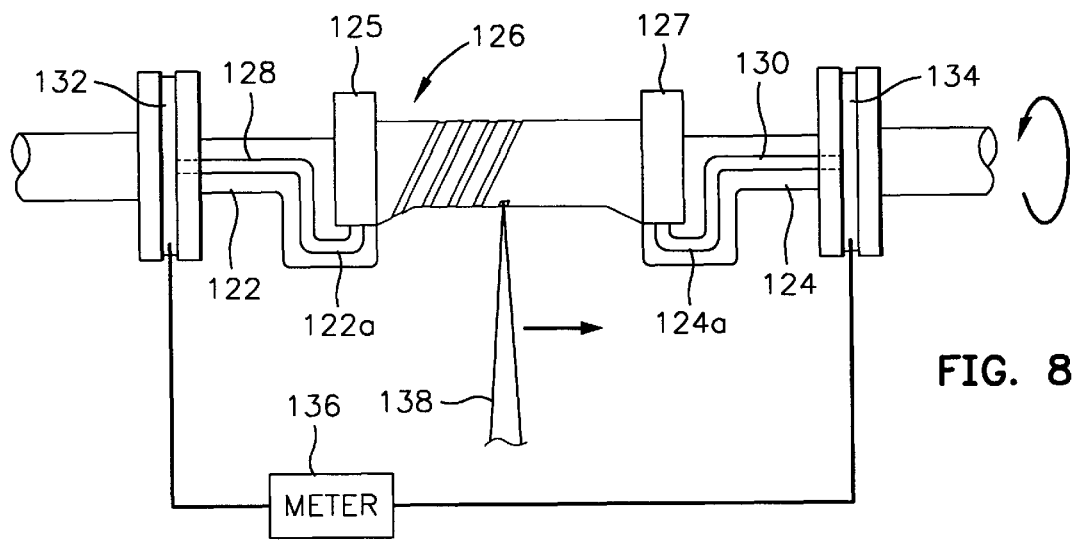
FIG. 8 is a side elevation view of an apparatus for the manufacture of an inductor of the present invention.
Figure 9:
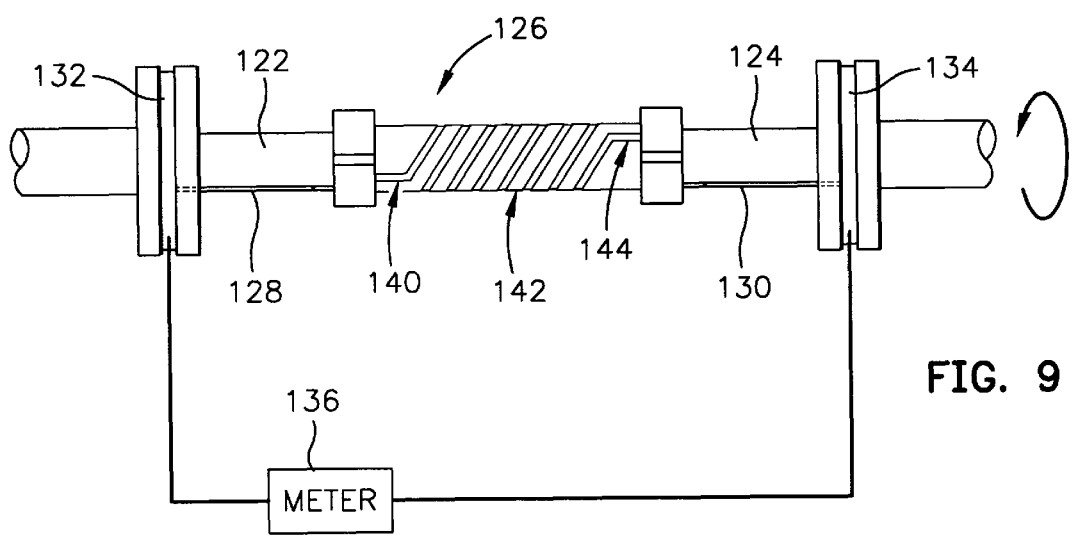
FIG. 9 is a top plan view of the embodiment of FIG. 8.

Referring to FIGS. 8 and 9, an apparatus is schematically illustrated wherein in accordance with a preferred embodiment of this process, inductance is monitored while the helical winding of the inductor is being made. The apparatus comprises a pair or dielectric mandrels 122 and 124 which are rotatable and aligned in opposed positions. The mandrels have an inner end which engages and supports a perform (i.e., a metallized substrate) 126 for an inductor and rotates it during the laser machining or forming of the winding thereof. Arms 122a and 124a position high frequency strip lines 128 and 130 in conductive contact with conductive bands 125 and 127 that form end caps. High frequency strip lines 128 and 130, extend along the mandrels and are connected through slip-rings 132 and 134 to a meter 136. A laser beam 138 is positioned to cut grooves into the metallized layer forming the helical conductive paths of the inductor.

While the laser is in the process of cutting the conductive windings for the inductor, the meter 136 monitors the inductance such that the inductor is effectively custom cut to the desired inductance. When the desired inductance is reached, the winding is terminated by connection directly to the terminal bands. This eliminates the need for certain adjustability in the circuit in which the inductor is placed.

The cut for forming the windings preferably has three regions as depicted in FIG. 9; an essentially straight start region 140, a helical coil region 142, and an essentially straight end region 144. These regions may have different respective lengths due to the number of turns needed to achieve a particular inductance value, the pitch and width of the resulting conductive traces and spaces between them. The geometry of a trace, the distance between the adjacent turns, as well as the angle the trace makes with the centerline of the coil influence characteristics of the resulting inductor. For instance, a wider conductive trace will produce an inductor with lower electrical resistance, and, therefore higher Q-value. The starting and ending regions 140 and 144 may be absent altogether if a helical region 142 takes up the whole space between the endfaces of the substrate.

The helical cut can be produced by a continuous, or a rapidly pulsed laser beam while the beam is translated in a helical fashion with respect to the substrate's longitudinal axis. This is commonly achieved by spinning the substrate while a laser beam is translated along the substrate's longitudinal axis. Alternatively, a laser can be translated in a helical path around the stationary substrate.

The straight cut sections are preferably made by a laser beam translated along the longitudinal axis of the substrate, while the substrate is held stationary. Alternatively, the straight sections can be cut while the substrate is spun around its longitudinal axis, by laser pulses which impinge on the substrate at particular locations. This process requires acquisition of the angular position of the substrate prior to generating each laser pulse, so that precise placement of laser beam is possible along the periphery of the substrate, thus producing an essentially straight cut along the longitudinal axis of the substrate.

Figure 10:
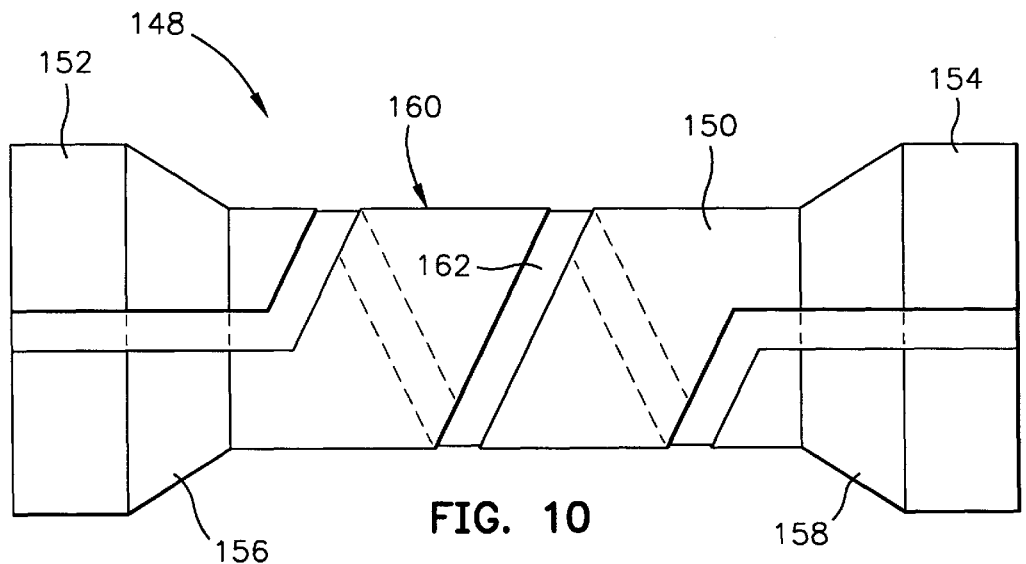
FIG. 10 is a top plan view illustrating a still further embodiment of the invention.

Referring to FIG. 10, a top plan view of a further embodiment of the invention is illustrated and designated generally by the numeral 148. This embodiment is formed of a substrate having the usual central smaller diameter main portion 150 with larger diameter end caps or rims 152 and 154. The end caps are formed with gradual transitions 156 and 158 from the central portion 150 to the larger diameter end rims 152 and 154. In forming the inductor, the entire outer surface of the substrate is metallized with a conductive coating 160 and formed by cuts 162, into windings of one or more turns which includes an interruption in the peripheral band on the end caps, as in prior embodiments.

The conductive structure or winding is formed in a spiral arrangement, as previously described, such as by means of a laser cutter. This configuration with the smoother transition from the central portion of the substrate to the larger diameter end rims facilitates continuous metallization and an easy cut or formation of the spiral conductive winding from end cap to end cap.

Figure 11:
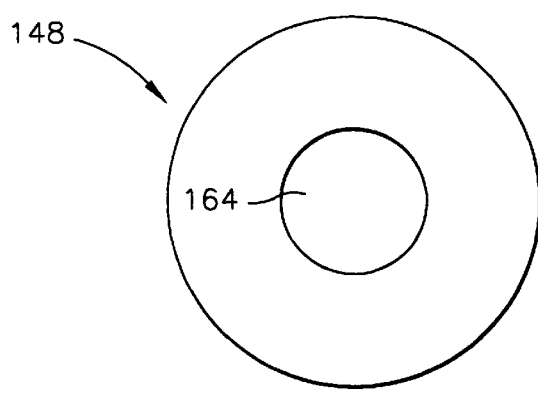
FIG. 11 is an end view of the embodiment of FIG. 10.

Referring to FIG. 11, the end piece and the substrate generally designated 148 may have any suitable configuration as previously described. In addition, the core or substrate may also be formed with a through bore 164 to further increase the Q-value.

Figure 12:
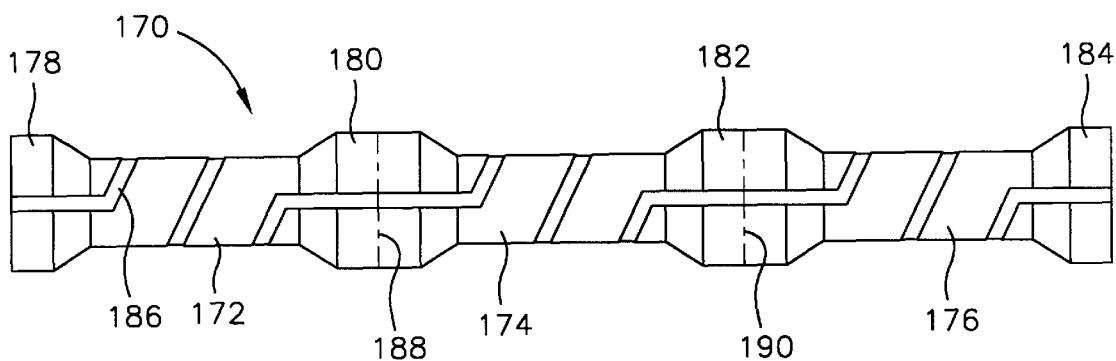
FIG. 12 is a top plan view illustrating a substrate in the process of manufacturing multiple inductors.

Referring to FIG. 12, a substrate designated generally by the numeral 170 is formed in a manner to produce multiple inductors. To this end the inductor is formed with center support sections 172 and 174 and 176 with structure forming end caps or rims in between. End caps or rims 178, 180, 182, and 184 separate the central portions and form end rims for the respective substrates. In forming the inductors the entire substrate is metallized as previously discussed covering the entire center sections, transition and end caps. Thereafter, the laser cuts may be made as a continuous cut at 186 forming the spiral wound conductors, including gaps on the respective end caps. Once the inductors are formed into the basic configuration they may be separated such as by scribing and breaking or cutting on lines 188 and 190, thereby separating the illustrated substrate into three separate inductors. Any multiple number of inductors may be made in this manner. Moreover, any of the illustrated inductors may be made in this manner.

While I have illustrated and described my invention by means of specific embodiments, it is to be understood that numerous changes and modifications may be made therein without departing from the spirit and scope of the invention, as defined in the appended claims. For example any of the features or modifications illustrated with any embodiment may be applied to any other embodiment.

I claim:

1. A monolithic inductor, comprising:
    an elongated substrate having opposite distal ends and having an integral, insulating end cap with a peripheral edge at each of said opposite ends extending radially beyond all sides of said substrate to support and space said substrate from a PC board, each end cap peripheral edge having a non-mounting area, said non-mounting area defined by a shape that causes the substrate to roll to either side from said non-mounting area;

an electrically conductive layer deposited on said substrate and extending between said opposite ends to provide a winding; and an electrically conductive terminal band deposited on and extending partially around said peripheral edge of each of said end caps in electrical contact with said conductive layer, each terminal band having a gap in said non-mounting area to thereby reduce parasitic losses.

2. An inductor according to claim 1 wherein said substrate is formed of ceramic.

3. An inductor according to claim 1 wherein said substrate is formed of ferrite material.

4. An inductor according to claim 1 wherein said conductive layer is a metal layer.

5. An inductor according to claim 4 wherein said metal layer is copper.

6. An inductor according to claim 1 wherein said non-mounting areas are rounded in a circumferential direction.

7. An inductor according to claim 6 herein said conductive layer is a metal layer.

8. An inductor according to claim 1 wherein said end caps are formed with substantially steep inner side walls adjacent said gaps.

9. An inductor according to claim 1 wherein said substrate is formed with inclined ramps extending up to a top of said end caps on said substrate substantially opposite said areas of said gaps.

* * * * *